(12) United States Patent
Brist et al.

(10) Patent No.: US 9,939,497 B2
(45) Date of Patent: Apr. 10, 2018

(54) DYNAMICALLY CALIBRATING MAGNETIC SENSORS

(71) Applicant: Intel Corporation, Santa Clara, CA (US)

(72) Inventors: Gary A. Brist, Yamhill, OR (US); Kevin J. Daniel, Aloha, OR (US); Melissa A. Cowan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1004 days.

(21) Appl. No.: 13/833,666

(22) Filed: Mar. 15, 2013

(65) Prior Publication Data

US 2014/0278190 A1 Sep. 18, 2014

(51) Int. Cl.
*G01R 33/025* (2006.01)
*G01R 35/00* (2006.01)
(Continued)

(52) U.S. Cl.
CPC .......... *G01R 33/025* (2013.01); *G01C 17/28* (2013.01); *G01C 17/38* (2013.01);
(Continued)

(58) Field of Classification Search
CPC .............. G01R 33/025; G01R 33/0035; G01R 33/0206; G01C 17/28; G01C 17/38
(Continued)

(56) References Cited

U.S. PATENT DOCUMENTS 6,408,251 B1   6/2002   Azuma
6,850,806 B2   2/2005   Yutkowitz
(Continued)

FOREIGN PATENT DOCUMENTS

CN   1042773 A   6/1990
CN   1624425 A   6/2005
(Continued)

OTHER PUBLICATIONS

Taiwan IPO Search Report, TW App. No. 103106272, dated Dec. 24, 2015, 2 pages.
(Continued)

*Primary Examiner* — Gregory J Toatley
*Assistant Examiner* — Terence Stifter, Jr.
(74) *Attorney, Agent, or Firm* — International IP Law Group, P.L.L.C.

(57) ABSTRACT

A computing device, system, apparatus, and at least one machine readable medium for dynamically calibrating a magnetic sensor are described herein. The computing device includes a sensor hub and a magnetic sensor communicably coupled to the sensor hub. The magnetic sensor is configured to collect sensor data corresponding to the computing device. The computing device also includes a processor that is configured to execute stored instructions and a storage device that stores instructions. The storage device includes processor executable code that, when executed by the processor, is configured to determine a system state of the computing device and send the determined system state of the computing device to the sensor hub. The sensor hub is configured to dynamically calibrate the magnetic sensor based on the sensor data collected via the magnetic sensor and the determined system state of the computing device.

23 Claims, 6 Drawing Sheets

(51) Int. Cl.
*G01C 17/28* (2006.01)
*G01C 17/38* (2006.01)
*G01R 33/00* (2006.01)
*G01R 33/02* (2006.01)

(52) U.S. Cl.
CPC ......... *G01R 33/0035* (2013.01); *G01R 35/00* (2013.01); *G01R 33/0206* (2013.01)

(58) Field of Classification Search
USPC ....................................................... 702/104
See application file for complete search history.

(56) References Cited

U.S. PATENT DOCUMENTS

| | | | |
|---|---|---|---|
| 7,057,173 | B2 | 6/2006 | Wright |
| 8,880,373 | B2 | 11/2014 | Kulik et al. |
| 2003/0056147 | A1 | 3/2003 | Yutkowitz |
| 2006/0021238 | A1 | 2/2006 | Sato et al. |
| 2008/0270060 | A1 | 10/2008 | Dunne |
| 2011/0106474 | A1* | 5/2011 | Kulik ................... G01C 17/38 702/92 |
| 2011/0106477 | A1* | 5/2011 | Brunner ............ G01R 33/0035 702/104 |
| 2011/0248704 | A1 | 10/2011 | Chowdhary et al. |
| 2011/0301897 | A1 | 12/2011 | Weiss et al. |
| 2012/0086438 | A1* | 4/2012 | Tu ...................... G01R 33/0035 324/202 |
| 2012/0101766 | A1* | 4/2012 | Snow .................... G01C 17/38 702/104 |
| 2012/0296596 | A1 | 11/2012 | Profitt |
| 2013/0085698 | A1* | 4/2013 | Wade .................... G01C 17/38 702/92 |

FOREIGN PATENT DOCUMENTS

| | | |
|---|---|---|
| JP | 2010175553 A | 8/2010 |
| JP | 2013510317 A | 3/2013 |
| TW | I262317 | 9/2006 |
| TW | I321217 | 3/2010 |
| WO | 01/09567 A1 | 2/2001 |
| WO | 2006035505 A1 | 4/2006 |
| WO | 2014/150241 A1 | 9/2014 |

OTHER PUBLICATIONS

International Search Report and Written Opinion received for PCT Patent Application No. PCT/US2014/022695, dated Jun. 24, 2014, 9 pages.
CN Search Report, CN Application No. 201480009071.6, dated Dec. 30, 2016, 1 page.
EP Search Report, CN Application No. 14767903, date of completion May 5, 2017, 2 pages.

* cited by examiner

100

500

DYNAMICALLY CALIBRATING MAGNETIC SENSORS

TECHNICAL FIELD

The present invention relates generally to dynamic calibration of magnetic sensors. More specifically, the present invention relates to a computing device, method, apparatus, and at least one machine readable medium for dynamically calibrating a magnetic sensor based on the system state of the computing device in which the magnetic sensor resides.

BACKGROUND ART

Magnetic sensors are often integrated within the platforms of computing devices and are used as compasses to measure or detect heading information, e.g., information relating to the direction the computing device is pointing. Such heading information may be used for navigation applications, perceptual computing applications, gaming applications, or the like. However, interference induced by the platforms of the computing devices may impede the proper functioning of the magnetic sensors, resulting in inaccurate heading measurements. Specifically, the magnetic field induced by the platform of a computing device at the input of a magnetic sensor may shift based on the system states of various components of the computing device and the proximity of the components to the magnetic sensor.

According to current techniques, such platform induced shifts in the magnetic field are accounted for by calculating, monitoring, and tracking the centroid of the magnetic sensor output within the plane of rotation. However, such techniques do not appropriately account for shifts in the magnetic field caused by changes in the system states of the components of the computing device. For example, such techniques do not account for shifts in the magnetic field seen at the sensor that are caused by changes in the power state of the computing device that may occur when the battery of the computing device is being charged or the overall power consumption of the computing device changes.

Currently, shifts in the magnetic field resulting from changes in the system states of components are handled in the same manner as shifts in the magnetic field resulting from changes in the external environment. According to such techniques, multiple sensor readings are used to detect a change in the external environment, and an algorithm is then used to calculate the shift in the magnetic field caused by the change in the external environment. As a result, the orientation output of the computing device reading the magnetic sensor will be incorrect during the time between the occurrence of the physical shift in the magnetic field and the detection and calculation of the shift in the magnetic field.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

As discussed above, interference induced by the platform of a computing device may impede the proper functioning of a magnetic sensor within the computing device by shifting the magnetic field induced by the platform at the input of the magnetic sensor. Moreover, current techniques do not automatically account for shifts in the magnetic field caused by changes in the system states of the components of the computing device.

The magnetic field measured by a magnetic sensor, e.g., $B_{sensor}$, in a platform of a computing device, with negligible distortion with respect to rotation, can be expressed as a vector addition of three magnetic fields and their respective coordinate systems, as shown below in Eq. (1). The three magnetic fields include the magnetic field induced by the platform, e.g., $B_{platform}$, the earth's magnetic field, e.g., $B_{earth}$, and any contribution from magnetic sources external to the platform, e.g., $B_{ambient}$.

$$B_{sensor}\begin{bmatrix}\hat{x}\\\hat{y}\\\hat{z}\end{bmatrix} = B_{platform}\begin{bmatrix}\hat{x}\\\hat{y}\\\hat{z}\end{bmatrix} + \left(B_{earth}\begin{bmatrix}x\\y\\z\end{bmatrix} + B_{ambient}\begin{bmatrix}x\\y\\z\end{bmatrix}\right)R(\phi,\theta,\varphi) \quad (1)$$

In Eq. (1), $$\begin{bmatrix}\hat{x}\\\hat{y}\\\hat{z}\end{bmatrix}$$

is equal to the platform/sensor coordinates, and $$\begin{bmatrix}x\\y\\z\end{bmatrix}$$

is equal to the world coordinates. In addition, $R(\varphi,\theta,\varphi)$ is the rotational translation matrix of the platform/sensor coordinates and the world coordinates. The absolute value of each vector is a function of both the strength of the magnetic sources and the proximity to the boundaries in both the world and platform/sensor coordinate systems.

The true heading of the platform can be determined according to Eq. (2).

$$\text{Magnetic North} = \arctan\left(\frac{B_{earth}y}{B_{earth}x}\right) \quad (2)$$

Current implementations for determining heading information adjust the magnetic sensor output by the platform induced magnetic field at the magnetic sensor in order to correctly calculate the angle from the arctan function shown in Eq. (2). However, this value may be shifted by magnetic fields induced by changes in the system states of the components of the computing device.

Figure 1:
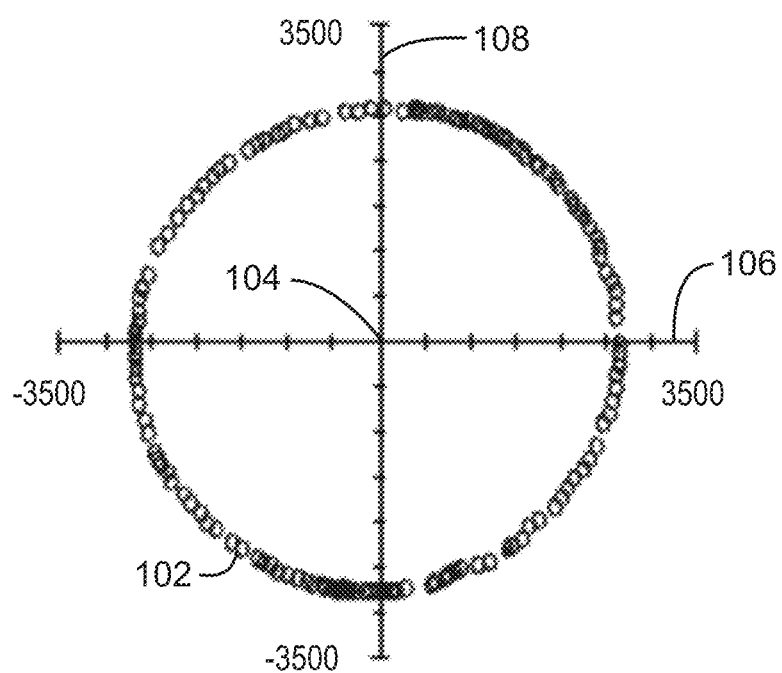
FIG. 1 is a graph showing an output of a magnetic sensor across all magnetic sensor orientations within a constant magnetic field.

FIG. 1 is a graph 100 showing an output 102 of a magnetic sensor across all magnetic sensor orientations within a constant magnetic field. As shown in FIG. 1, the magnetic sensor generates a centroid 104 at the origin, i.e., at an x-y coordinate of (0, 0), when rotated about the magnetic sensor's z-axis in a constant magnetic field. An x-axis 106 of the graph 100 represents a number of counts in the x-direction, and a y-axis 108 of the graph 100 represents a number of counts in the y-direction.

Figure 2:
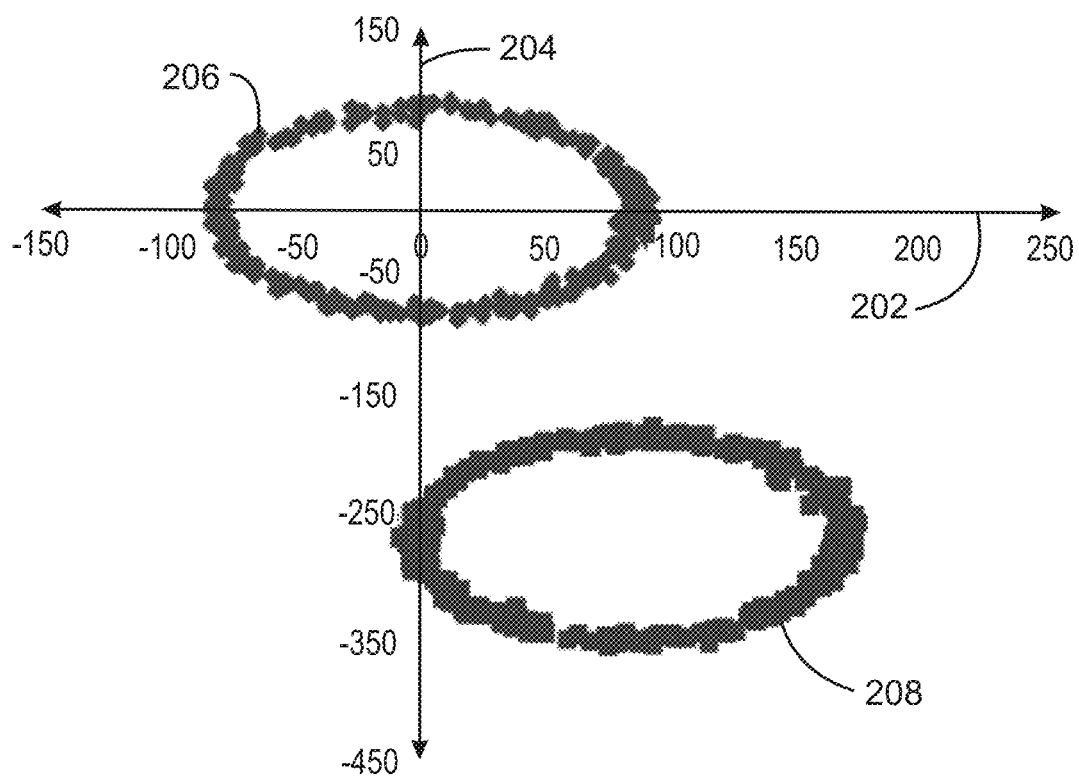
FIG. 2 is a graph showing a shift in an output of a magnetic sensor.

FIG. 2 is a graph 200 showing a shift in an output of a magnetic sensor. An x-axis 202 of the graph 200 represents a number of counts in the x-direction, and a y-axis 204 of the graph 200 represents a number of counts in the y-direction. The graph 200 shows an output 206 of the magnetic sensor for an ideal case. The graph 200 also shows an output 208 of the magnetic sensor for a case in which the computing device contains a magnetic field source that is fixed within the same reference frame of the magnetic sensor and, thus, produces a constant shift across all orientations. A sensor output can be shifted when the computing device has experienced a change in the system state of one or more components.

According to current techniques, computing devices rely on complex tracking algorithms to estimate shifts due to platform induced magnetic fields, or rely on a static offset determined at factory calibration. However, a change in the system state of one or more components of a computing device, if in sufficient proximity, can induce one or more new localized magnetic fields that are detectable by the magnetic sensor. The instantaneous shift in the output of the magnetic sensor caused by such magnetic fields is not automatically accounted for according to current techniques.

Therefore, embodiments described herein provide for state driven calibration of magnetic sensors. Specifically, embodiments described herein provide a computing device, method, and at least one machine readable medium for dynamically correcting the output of a magnetic sensor of a computing device based on calibration offset values derived from the system state of the computing device.

Embodiments described herein may eliminate sources of erroneous directional heading calculations directly following shifts in sensor response and reduce the amount of time it takes to detect a shift in magnetic sensor response. Further, embodiments described herein may reduce the computational workload associated with calculating and tracking sensor shifts due to the system state of the computing device. As a result, the magnetic sensor may be able to track the true heading despite platform induced shifts in the magnetic field.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, described herein. The various appearances "an embodiment," "one embodiment," or "some embodiments" are not necessarily all referring to the same embodiments.

Not all components, features, structures, or characteristics described and illustrated herein are to be included in a particular embodiment or embodiments in every case. If the specification states a component, feature, structure, or characteristic "may", "might", "can" or "could" be included, for example, that particular component, feature, structure, or characteristic may not be included in every case. If the specification or claims refer to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein may not be arranged in the particular way illustrated and described herein. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

Figure 3:
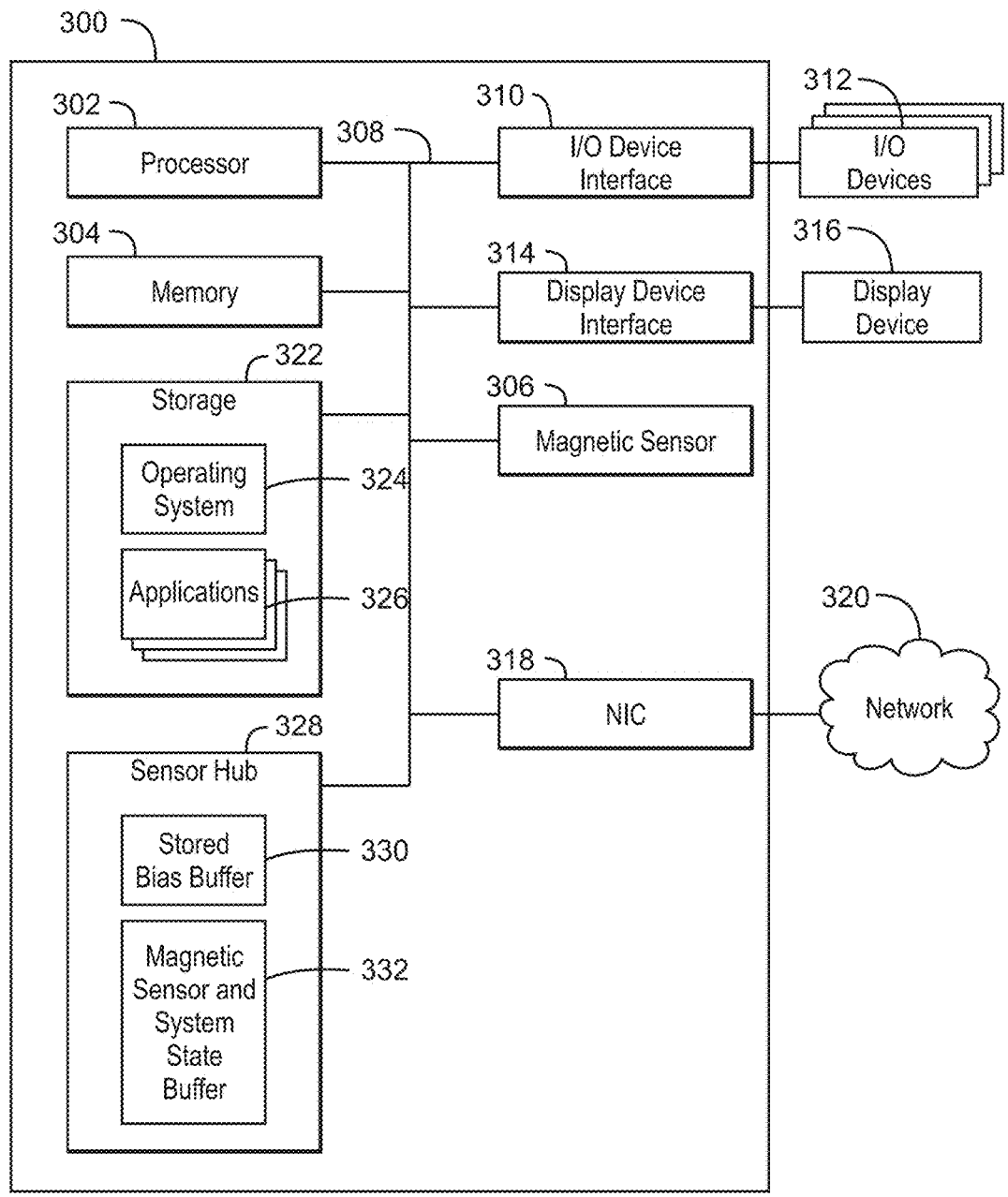
FIG. 3 is a block diagram of a computing device in which the technique for dynamically calibrating magnetic sensors described herein may be implemented.

FIG. 3 is a block diagram of a computing device 300 in which the technique for dynamically calibrating magnetic sensors described herein may be implemented. The computing device 300 may be, for example, a laptop computer, desktop computer, tablet computer, mobile device, server, or cellular phone, among others. The computing device 300 may include a processor 302 that is adapted to execute stored instructions, as well as a memory device 304 that stores instructions that are executable by the processor 302. The processor 302 can be a single core processor, a multi-core processor, a computing cluster, or any number of other configurations. The processor 302 may be implemented as Complex Instruction Set Computer (CISC) or Reduced Instruction Set Computer (RISC) processors, x86 Instruction set compatible processors, multi-core, or any other microprocessor or central processing unit (CPU). In some embodiments, the processor 302 includes dual-core processor(s), dual-core mobile processor(s), or the like.

The memory device 304 can include random access memory (e.g., SRAM, DRAM, zero capacitor RAM, SONOS, eDRAM, EDO RAM, DDR RAM, RRAM, PRAM, or the like), read only memory (e.g., Mask ROM, PROM, EPROM, EEPROM, or the like), flash memory, or any other suitable memory systems. The memory device 304 stores instructions that are executable by the processor 302 and are used to provide support for dynamically calibrating a magnetic sensor 306 implemented within the computing device 300 based on the system state of the computing device 300.

The processor 302 may be connected through a system bus 308 (e.g., PCI, ISA, PCI-Express, HyperTransport®, NuBus, or the like) to an input/output (I/O) device interface 310 adapted to connect the computing device 300 to one or more I/O devices 312. The I/O devices 312 may include, for example, a keyboard, a pointing device, and the like. The pointing device may include a touchpad or a touchscreen, among others. The I/O devices 312 may be built-in components of the computing device 300, or may be devices that are externally connected to the computing device 300.

The processor 302 may also be linked through the system bus 308 to a display device interface 314 adapted to connect the computing device 300 to a display device 316. The display device 316 may include a display screen that is a built-in component of the computing device 300. The display device 316 may also include a computer monitor, television, or projector, among others, that is externally connected to the computing device 300.

The processor 302 may also be linked through the bus 308 to a network interface controller (NIC) 318. The NIC 318 may be configured to connect the processor 302 through the bus 308 to a network 320. The network 320 may be a wide area network (WAN), local area network (LAN), or the Internet, among others.

The computing device 300 may also include a storage device 322. The storage device 322 may include a physical memory such as a hard drive, an optical drive, a flash drive, an array of drives, or the like. The storage device 322 may also include remote storage drives. The storage device 322 may store instructions thereon to provide support for dynamically calibrating the magnetic sensor 306 based on the system state of the computing device 300. In various embodiments, the system state of the computing device 300 includes a summation of the system states of various individual components of the computing device 300.

The storage device 322 may include an operating system 324. The operating system 324 may have installed thereon one or more drivers. The drivers may enable a piece of hardware or one or more applications 326 installed on the operating system 324 and residing within the storage device 322 to communicate with the operating system 324 or other hardware of the computing device 300, including the magnetic sensor 306. The drivers may also be used to enable a sensor hub (or controller) 328 to communicate sensor data from the magnetic sensor 306 to any of the one or more applications 326 installed on the operating system 324.

In various embodiments, the magnetic sensor 306 is connected to the processor 302 via the bus 308. The magnetic sensor 306 may also be connected directly to the processor 302 via a private bus or sensor interface (not shown). Further, in various embodiments, the magnetic sensor 306 is communicably coupled to a sensor hub 328 via the sensor interface. The sensor hub 328 may be configured to collect sensor data from the magnetic sensor 306. In some embodiments, one or more microcontrollers within the computing device 300 may provide the sensor data collected via the magnetic sensor 306 to the sensor hub 328. The sensor data may include data relating to magnetic heading, magnetic north, global position, altitude, or proximity to another computing device, for example.

The sensor hub 328 may also be configured to dynamically calibrate the magnetic sensor 306 based on the sensor data collected via the magnetic sensor 306 and the current system state of the computing device 300. In various embodiments, the sensor hub 328 performs such a dynamic calibration procedure using calibration offset values that are stored within a stored bias buffer 330, as discussed further with respect to FIG. 4. In addition, the sensor hub 328 may continuously or periodically update the calibration offset values within the stored bias buffer 330 based on a magnetic sensor and system state buffer 332, as also discussed further with respect to FIG. 4.

In some embodiments, the sensor hub 328 operates at the kernel level and is implemented via the operating system 324 of the computing device 300. In other embodiments, the sensor hub 328 operates at the processor level and is implemented via the processor 302 and any number of other hardware residing within the computing device 300. Furthermore, in various embodiments, the sensor hub 328 is simultaneously implemented via both the operating system 324 and the processor 302. This may be desirable because, in some cases, the processor 302 may be aware of data relating to specific system state change events that are not exposed to the operating system 324. In addition, in some cases, the operating system 324 may be aware of data relating to specific system state change events for newly installed hardware, such as a web cam or a radio, for example, that are not exposed to the processor 302.

In addition, in some embodiments, the sensor hub 328 includes firmware. For example, the sensor hub 328 may include resistor-transistor logic (RTL) or any other suitable type of logic that exists at the kernel level and/or at the processor level.

It is to be understood that the block diagram of FIG. 3 is not intended to indicate that the computing device 300 is to include all of the components shown in FIG. 3. Further, the computing device 300 may include any number of additional components not shown in FIG. 3, depending on the details of the specific implementation.

Figure 4:
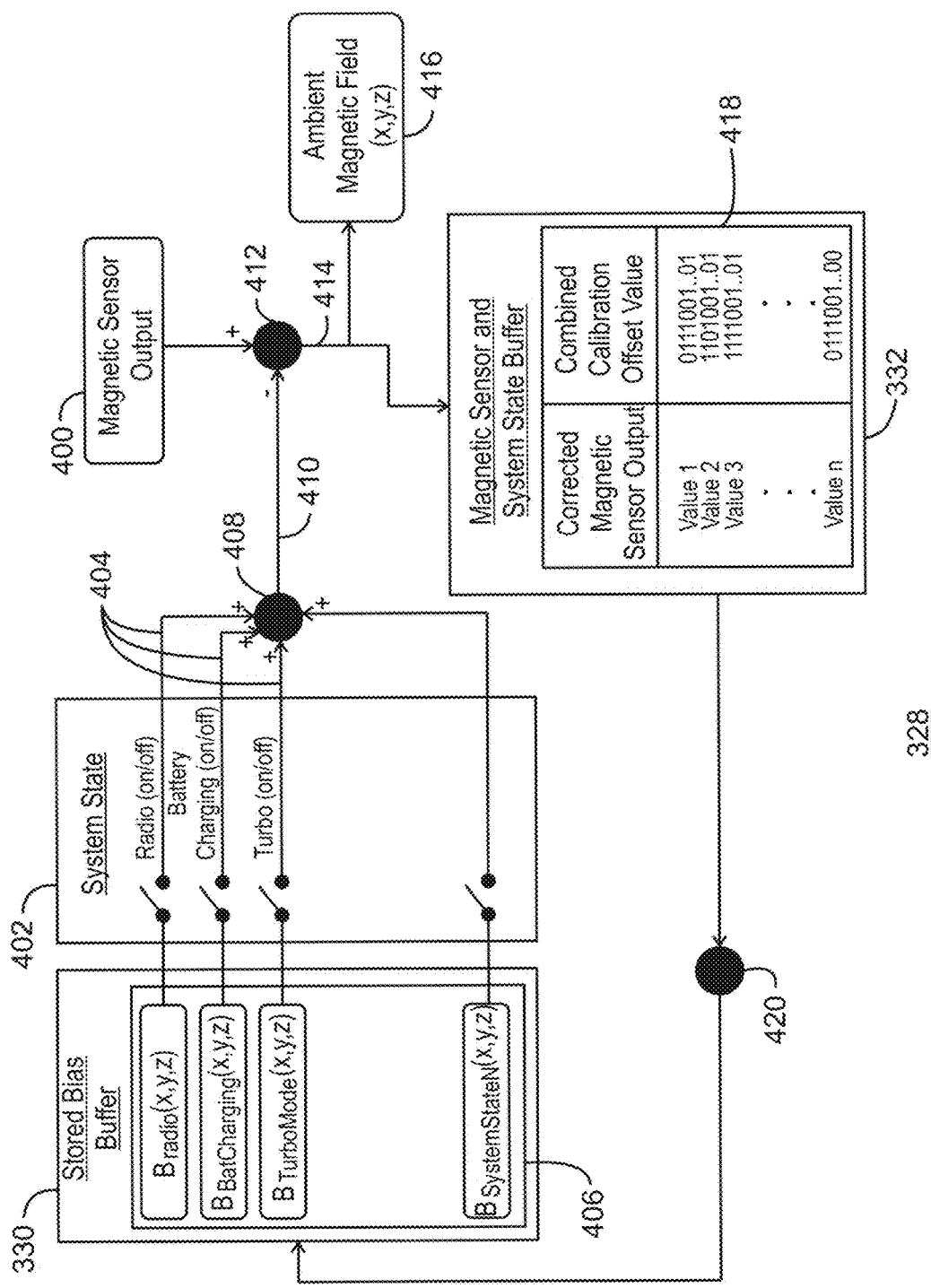
FIG. 4 is a block diagram of the sensor hub of the computing device of FIG. 3.

FIG. 4 is a block diagram of the sensor hub 328 of the computing device 300 of FIG. 3. Like numbered items are as described with respect to FIG. 3. As shown in FIG. 3, the sensor hub 328 may receive sensor data from the magnetic sensor in the form of a magnetic sensor output 400. The sensor hub 328 may then determine a system state 402 of the computing device 300 based on a number of detected system state change events. Such system state change events may include, for example, turning on a radio of the computing device 300, charging a battery of the computing device 300, or placing the processor 302 of the computing device 300 in a turbo mode. In various embodiments, the system state change events are detected via the processor 302, one or more microcontrollers, or other hardware residing within the computing device 300, and the detected system state change events are then sent to the sensor hub 328.

In various embodiments, the sensor hub 328 may determine a calibration offset value 404 for each detected system state change event from a calibration offset table 406 residing within the stored bias buffer 330. The calibration offset table 406 may be generated based on various system states of the computing device 300. The calibration offset table 406 may be used to maintain the performance of the magnetic sensor 306 in real-time. Specifically, the calibration offset table 406 may include calibration offset values relating to various system state change events, as shown below in Table 1. In some embodiments, the calibration offset values may be measured and stored in the calibration offset table 406 of the stored bias buffer 330 during the boot-up sequence of the computing device 300.

TABLE 1

Exemplary Calibration Offset Table

| System state Change Events | Calibration Offset Value ($B_{System\ State}$) |
| --- | --- |
| Wireless Radio On/Off | $B_{Radio}$ |
| Turbo Mode On/Off | $B_{CPU}$ |
| Web Cam On/Off | $B_{Webcam}$ |
| Battery Charging | $B_{Charging}$ |

A system state determination module 408 within the sensor hub 328 may then determine a combined calibration offset value 410 corresponding to the determined system state 402 of the computing device 300 by summing the calibration offset values 404 for the system state change events. The combined calibration offset value 410 may be sent to a corrected magnetic sensor output determination module 412, as shown in FIG. 4. The corrected magnetic sensor output determination module 412 may subtract the combined calibration offset value 410 from the magnetic sensor output 400 collected via the magnetic sensor to obtain a corrected magnetic sensor output 414. More specifically, the corrected magnetic sensor determination module 412 may determine the corrected magnetic field for the magnetic sensor, e.g., $B_{Corrected}$, based on the magnetic field measured by the magnetic sensor 306, e.g., $B_{Measured}$, and a combined calibration offset value that accounts for shifts in the magnetic field induced by changes in the system state of the computing device 300, e.g., $B_{System\ State}$, as shown below in Eq. (3).

$$B_{Corrected} = B_{Measured} - \Sigma B_{System\ State} \quad (3)$$

In various embodiments, the corrected magnetic sensor output 414 may be provided to any number of applications executing on the computing device 300 as an ambient magnetic field 416 of the computing device 300. In addition, in various embodiments, the corrected magnetic sensor output 414, as well as the combined calibration offset value 410, may be provided to the magnetic sensor and system state buffer 332. The magnetic sensor and system state buffer 332 may be used to update the calibration offset values within the calibration offset table 406 of the stored bias buffer 330. Specifically, the magnetic sensor and system state buffer 332 may include a table 418 that lists past corrected magnetic sensor outputs and the corresponding combined calibration offset values. In various embodiments, the table 418 may be continuously updated with the current corrected magnetic sensor output 414 and the current combined calibration offset value 410.

In various embodiments, the current corrected magnetic sensor output 414 and the current combined calibration offset value 410, as well as information relating to the updated table 418, may be sent to a dynamic magnetic sensor calibration module 420. The dynamic magnetic sensor calibration module 420 may then dynamically calibrate the magnetic sensor 306 of the computing device 300 via real-time updating of the calibration offset values within the calibration offset table 406 of the stored bias buffer 330. Specifically, the current corrected magnetic sensor output 414 and the current combined calibration offset value 410 may be compared to the existing calibration offset values, and the existing calibration offset values may be altered or replaced in the calibration offset table 406 of the stored bias buffer 330 if the data indicates that conditions for any of the corresponding system state change events have changed.

It is to be understood that the block diagram of FIG. 4 is not intended to indicate that the sensor hub 328 is to include all the components shown in FIG. 4. Further, the sensor hub 328 may include any number of additional components not shown FIG. 4, depending on the details of the specific implementation.

Figure 5:
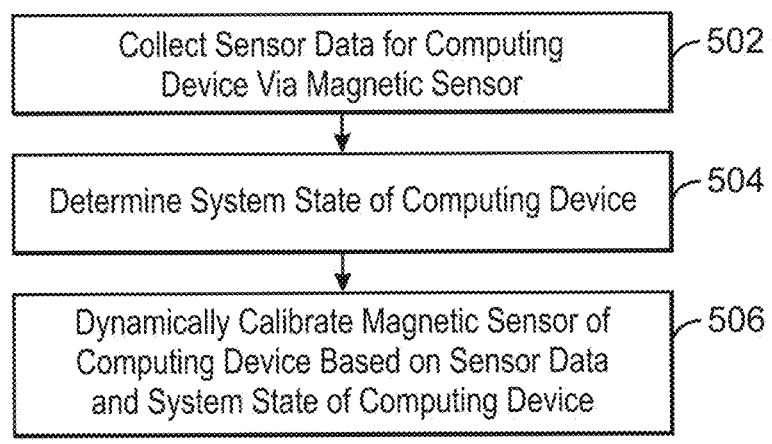
FIG. 5 is a process flow diagram of a method for dynamically calibrating a magnetic sensor of a computing device.

FIG. 5 is a process flow diagram of a method 500 for dynamically calibrating a magnetic sensor of a computing device. The method 500 may be implemented by the computing device in which the magnetic sensor resides. The computing device may be the computing device 300 discussed with respect to FIGS. 3 and 4, or may be any suitable computing device including a magnetic sensor that may be dynamically calibrated according to the techniques described herein.

The method 500 begins at block 502, at which sensor data for the computing device is collected via the magnetic sensor. The sensor data may be the output of the magnetic sensor. The sensor data may include data relating to magnetic heading, magnetic north, global position, altitude, or proximity to another computing device, for example.

At block 504, the system state of the computing device is determined. The system state of the computing device may be determined based on the system states of various individual components of the computing device. Further, the system state of the computing device may be determined based on any number of system state change events, such as turning on the radio of the computing device or charging the battery of the computing device, for example.

At block 506, the magnetic sensor of the computing device is dynamically calibrated based on the sensor data and the system state of the computing device. In various embodiments, dynamically calibrating the magnetic sensor includes determining a calibration offset value for a system state change event corresponding to the determined system state of the computing device and using the calibration offset value to correct the magnetic sensor output. Specifically, the magnetic sensor output may be corrected to account for shifts in the magnetic field caused by changes in the system states of various components of the computing device. The corrected output of the magnetic sensor may then be provided to an application executing on the computing device.

Further, in some embodiments, dynamically calibrating the magnetic sensor includes determining a calibration offset value for each of a number of system state change events corresponding to the determined system state of the computing device. A combined calibration offset value may be determined by summing the calibration offset values for the system state change events, and the magnetic sensor output may be corrected by subtracting the combined calibration offset value from the magnetic sensor output value. The corrected magnetic sensor output may then be provided to an application executing on the computing device.

In various embodiments, the calibration offset values for the system state change events may be determined during the boot-up sequence of the computing device. Furthermore, the calibration offset values may be updated in real-time by comparing the current corrected magnetic sensor output and the current combined calibration offset value to the existing calibration offset values, and altering or replacing the existing calibration offset values if the data indicates that conditions for any of the corresponding system state change events have changed.

It is to be understood that the process flow diagram of FIG. 5 is not intended to indicate the blocks of the method 500 are to be executed in any particular order, or that all of the blocks of the method 500 are to be included in every case. Further, any number of additional blocks may be included within the method 500, depending on the details of the specific implementation.

The method 500 may be used for a variety of applications. For example, in various embodiments, the calibration of a magnetic sensor of a computing device according to the method 500 allows any number of location applications (or applications that utilize any type of location information) executing on the computing device to function properly.

Figure 6:
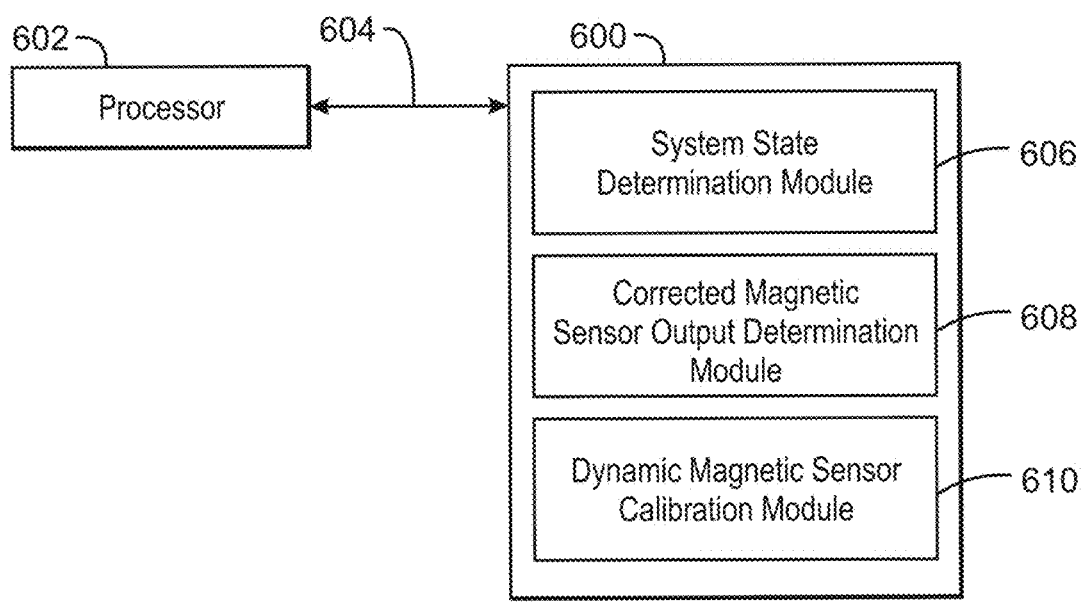
FIG. 6 is a block diagram showing a tangible, non-transitory machine readable medium that stores code for dynamically calibrating a magnetic sensor of a computing device.

FIG. 6 is a block diagram showing a tangible, non-transitory machine readable medium 600 that stores code for dynamically calibrating a magnetic sensor of a computing device. The tangible, non-transitory machine readable medium 600 may be accessed by a processor 602 over a computer bus 604. Furthermore, the tangible, non-transitory machine readable medium 600 may include code configured to direct the processor 602 to perform the methods described herein.

The various software components discussed herein may be stored on the tangible, non-transitory machine readable medium 600, as indicated in FIG. 6. For example, a system state determination module 606 may be configured to determine the system state of the computing device. In addition, a corrected magnetic sensor output determination module 608 may be configured to correct an output of the magnetic sensor based on the system state of the computing device. Further, a dynamic magnetic sensor calibration module 610 may be configured to dynamically calibrate the magnetic sensor of the computing device based on the system state of the computing and the corrected magnetic sensor output.

It is to be understood that the block diagram of FIG. 6 is not intended to indicate that the tangible, non-transitory machine readable medium 600 is to include all of the components shown in FIG. 6. Further, any number of additional components not shown in FIG. 6 may be included within the tangible, non-transitory machine readable medium 600, depending on the details of the specific implementation.

Example 1

A computing device is provided herein. The computing device includes a sensor hub and a magnetic sensor communicably coupled to the sensor hub. The magnetic sensor is configured to collect sensor data corresponding to the computing device. The computing device also includes a processor and a storage device. The storage device includes processor executable code that, when executed by the processor, is configured to determine a system state of the computing device and send the determined system state of the computing device to the sensor hub. The sensor hub is configured to dynamically calibrate the magnetic sensor based on the sensor data collected via the magnetic sensor and the determined system state of the computing device.

The sensor hub may be configured to dynamically calibrate the magnetic sensor by determining a calibration offset value for a system state change event corresponding to the determined system state of the computing device, and using the calibration offset value to correct an output of the magnetic sensor including the sensor data. Specifically, the sensor hub may be configured to correct the output of the magnetic sensor by subtracting the calibration offset value from a value of the output of the magnetic sensor. The corrected output of the magnetic sensor may include an ambient magnetic field corresponding to the computing device, and the sensor hub may be configured to provide the ambient magnetic field to an application executing on the computing device.

Further, the sensor hub may be configured to dynamically calibrate the magnetic sensor by determining a calibration offset value for each of a number of system state change events corresponding to the determined system state of the computing device, and using the calibration offset values to correct an output of the magnetic sensor including the sensor data. Specifically, the sensor hub may be configured to determine a combined calibration offset value corresponding to the determined system state of the computing device by summing the calibration offset values for the system state change events, and correct the output of the magnetic sensor by subtracting the combined calibration offset value from a value of the output of the magnetic sensor. The corrected output of the magnetic sensor may include an ambient magnetic field corresponding to the computing device, and the sensor hub may be configured to provide the ambient magnetic field to an application executing on the computing device.

The sensor hub may be implemented via an operating system of the computing device, or may be implemented via the processor of the computing device. In addition, the sensor hub may be implemented via both the operating system and the processor of the computing device. Further, the magnetic sensor may be communicably coupled to the sensor hub and the processor via a sensor interface.

Example 2

A method for dynamically calibrating a magnetic sensor of a computing device is provided herein. The method includes collecting sensor data for a computing device via a magnetic sensor, determining a system state of the computing device, and dynamically calibrating the magnetic sensor of the computing device based on the sensor data and the system state of the computing device.

Dynamically calibrating the magnetic sensor may include determining a calibration offset value for a system state change event corresponding to the determined system state of the computing device. The calibration offset value may be used to correct an output of the magnetic sensor including the sensor data. The corrected output of the magnetic sensor may be provided to an application executing on the computing device.

Furthermore, dynamically calibrating the magnetic sensor may include determining a calibration offset value for each of a number of system state change events corresponding to the determined system state of the computing device and determining a combined calibration offset value by summing the calibration offset values for the system state change events. The output of the magnetic sensor may then be corrected by subtracting the combined calibration offset value from a value of the output of the magnetic sensor. The corrected output of the magnetic sensor may be provided to an application executing on the computing device.

Example 3

At least one machine readable medium is provided herein. The machine readable medium includes instructions stored therein that, in response to being executed on a processor, cause the processor to determine an output of a magnetic sensor residing within a computing device. The output includes sensor data. The instructions cause the processor to determine a system state of the computing device and determine a calibration offset value for each of a number of system state change events corresponding to the determined system state of the computing device. The instructions also cause the processor to calculate a combined calibration offset value by summing the calibration offset values for the system state change events and calculate a corrected output of the magnetic sensor by subtracting the combined calibration offset value from a value of the output of the magnetic sensor. The instructions further cause the processor to dynamically calibrate the magnetic sensor by updating the calibration offset values for any of the system state change events based on the combined calibration offset value and the corrected output of the magnetic sensor.

The instructions may also cause the processor to provide the corrected output of the magnetic sensor to one or more applications executing on the computing device. The corrected output of the magnetic sensor may include an ambient magnetic field corresponding to the computing device.

Example 4

An apparatus for dynamically calibrating a magnetic sensor is provided herein. The apparatus includes a magnetic sensor, a processor, and a storage device including processor executable code that, when executed by the processor, is configured to collect sensor data for the apparatus via the magnetic sensor and determine a system state of the apparatus. The apparatus also includes a controller configured to dynamically calibrate the magnetic sensor based on the sensor data and the system state of the apparatus.

The controller may include a sensor hub. The controller may be configured to dynamically calibrate the magnetic sensor by determining a calibration offset value for a system state change event corresponding to the determined system state of the apparatus and using the calibration offset value to correct an output of the magnetic sensor comprising the sensor data. The processor executable code may be configured to provide the corrected output of the magnetic sensor to an application executing on the apparatus.

It is to be understood that specifics in the aforementioned examples may be used anywhere in one or more embodiments. For instance, all optional features of the computing device described above may also be implemented with respect to either of the methods or the machine readable medium described herein. Furthermore, although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A computing device, comprising:
a sensor hub;
a magnetic sensor communicably coupled to the sensor hub, wherein the magnetic sensor is configured to collect sensor data corresponding to the computing device;
a processor; and
a storage device comprising processor executable code that, when executed by the processor, is configured to:
determine a system state of the computing device, wherein the system state is a summation of a system state of various individual components of the computing device, wherein the system state causes a shift in a magnetic field; and
send the determined system state of the computing device to the sensor hub; and
wherein the sensor hub is configured to dynamically calibrate the magnetic sensor based on the sensor data collected via the magnetic sensor and the determined system state of the computing device by shifting the magnetic sensor output according to a combined calibration offset value corresponding to the determined system state of the computing device by summing a calibration offset value for each state change event of a plurality of system state change events.

2. The computing device of claim 1, wherein the sensor hub is configured to dynamically calibrate the magnetic sensor by determining the calibration offset value for each system state change event corresponding to the determined system state of the computing device, and using the combined calibration offset value to correct an output of the magnetic sensor comprising the sensor data.

3. The computing device of claim 2, wherein the sensor hub is configured to correct the output of the magnetic sensor by subtracting the combined calibration offset value from a value of the output of the magnetic sensor.

4. The computing device of claim 2, wherein the corrected output of the magnetic sensor comprises an ambient magnetic field corresponding to the computing device, and wherein the sensor hub is configured to provide the ambient magnetic field to an application executing on the computing device.

5. The computing device of claim 1, wherein the sensor hub is configured to:
correct the output of the magnetic sensor by subtracting the combined calibration offset value from a value of the output of the magnetic sensor.

6. The computing device of claim 1, wherein the corrected output of the magnetic sensor comprises an ambient magnetic field corresponding to the computing device, and wherein the sensor hub is configured to provide the ambient magnetic field to an application executing on the computing device.

7. The computing device of claim 1, wherein the sensor hub is implemented via an operating system of the computing device.

8. The computing device of claim 1, wherein the sensor hub is implemented via the processor of the computing device.

9. The computing device of claim 1, wherein the sensor hub is implemented via both an operating system of the computing device and the processor of the computing device.

10. The computing device of claim 1, wherein the magnetic sensor is communicably coupled to the sensor hub and the processor via a sensor interface.

11. A method for dynamically calibrating a magnetic sensor of a computing device, comprising:

collecting sensor data for a computing device via a magnetic sensor;

determining a system state of the computing device, wherein the system state is a summation of a system state of various individual components of the computing device, wherein the system state causes a shift in a magnetic field; and dynamically calibrating the magnetic sensor of the computing device based on the sensor data and the system state of the computing device by shifting the magnetic sensor output according to a combined calibration offset value corresponding to the determined system state of the computing device by summing a calibration offset value for each state change event of a plurality of system state change events.

12. The method of claim 11, wherein dynamically calibrating the magnetic sensor comprises determining the calibration offset value for each system state change event corresponding to the determined system state of the computing device.

13. The method of claim 12, comprising using the combined calibration offset value to correct an output of the magnetic sensor comprising the sensor data.

14. The method of claim 13, comprising providing the corrected output of the magnetic sensor to an application executing on the computing device.

15. The method of claim 11, wherein dynamically calibrating the magnetic sensor comprises correcting an output of the magnetic sensor by subtracting the combined calibration offset value from a value of the output of the magnetic sensor.

16. The computing device of claim 15, comprising providing the corrected output of the magnetic sensor to an application executing on the computing device.

17. At least one machine readable medium having instructions stored therein that, in response to being executed on a processor, cause the processor to:

determine an output of a magnetic sensor residing within a computing device, wherein the output comprises sensor data;

determine a system state of the computing device, wherein the system state is a summation of a system state of various individual components of the computing device, wherein the system state causes a shift in a magnetic field;

determine a calibration offset value for each system state change event corresponding to the determined system state, wherein the calibration offset value is derived from at least one system state change event, and wherein a table of calibration offset values is continuously updated in real-time;

calculate a combined calibration offset value by summing the calibration offset values for the system state change events;

calculate a corrected output of the magnetic sensor by subtracting the combined calibration offset value from a value of the output of the magnetic sensor; and dynamically calibrate the magnetic sensor by updating the calibration offset values for any of the system state change events based on the combined calibration offset value and the corrected output of the magnetic sensor.

18. The at least one machine readable medium of claim 17, wherein the instructions cause the processor to provide the corrected output of the magnetic sensor to one or more applications executing on the computing device.

19. The at least one machine readable medium of claim 17, wherein the corrected output of the magnetic sensor comprises an ambient magnetic field corresponding to the computing device.

20. An apparatus for dynamically calibrating a magnetic sensor, comprising:

a magnetic sensor;

a processor;

a storage device comprising processor executable code that, when executed by the processor, is configured to:

collect sensor data for the apparatus via the magnetic sensor; and determine a system state of the apparatus, wherein the system state is a summation of a system state of various individual components of the apparatus wherein the system state causes a shift in a magnetic field; and a controller configured to dynamically calibrate the magnetic sensor based on the sensor data and the system state of the apparatus by shifting the magnetic sensor output according to a combined calibration offset value corresponding to the determined system state of the computing device by summing a calibration offset value for each state change event of a plurality of system state change events.

21. The apparatus of claim 20, wherein the controller comprises a sensor hub.

22. The apparatus of claim 20, wherein the controller is configured to dynamically calibrate the magnetic sensor by determining the calibration offset value for each system state change event corresponding to the determined system state of the apparatus and using the combined calibration offset value to correct an output of the magnetic sensor comprising the sensor data.

23. The apparatus of claim 22, wherein the processor executable code is configured to provide the corrected output of the magnetic sensor to an application executing on the apparatus.

* * * * *